United States Patent [19]

Michon

[11] Patent Number: 5,565,692

[45] Date of Patent: Oct. 15, 1996

[54] INSULATED GATE TRANSISTOR ELECTROSTATIC CHARGE PROTECTION

[75] Inventor: Gerald J. Michon, Waterford, N.Y.

[73] Assignee: General Electric Company, Schenectady, N.Y.

[21] Appl. No.: 371,917

[22] Filed: Jan. 12, 1995

[51] Int. Cl.⁶ .................................................. H01L 31/0312
[52] U.S. Cl. .......................... 257/77; 257/356; 257/363; 257/368; 257/392; 361/91
[58] Field of Search ........................ 257/355, 356, 257/360, 363, 348, 392, 77, 368; 361/56, 91

[56] References Cited

U.S. PATENT DOCUMENTS

| | | | |
|---|---|---|---|
| 4,449,158 | 5/1984 | Taira | 257/379 |
| 5,111,262 | 5/1992 | Chen et al. | 257/360 |
| 5,385,855 | 1/1995 | Brown et al. | 257/77 |

*Primary Examiner*—Mark V. Prenty
*Attorney, Agent, or Firm*—Marvin Snyder

[57] ABSTRACT

For protecting the gate insulating layer of an insulated gate field-effect transistor from electrostatic charges, the main terminals of a depletion mode (normally conducting) field-effect transistor, serving as a protection transistor, are connected between the gate and source terminals of the transistor to be protected, thus providing a shunt path for electrostatic charges when the protection transistor is not biased out of conduction. For normal operation, the protection transistor is biased out of conduction by applying to its gate terminal the voltage drop across a biasing resistor in series with the source terminal of the insulated gate field-effect transistor. This protection arrangement is particularly advantageous for silicon carbide field-effect transistors which are not readily suited to application of conventional (i.e. silicon transistor) gate insulating layer protection techniques.

6 Claims, 1 Drawing Sheet

INSULATED GATE TRANSISTOR ELECTROSTATIC CHARGE PROTECTION

The U.S. Government has a paid-up license in this invention and the right in limited circumstances to require the patent owner to license others on reasonable terms as provided for by the terms of contract No. F33615-90-1494 awarded by the U.S. Air Force.

BACKGROUND OF THE INVENTION

This invention relates to the protection of insulated gate transistors from electrostatic charges, particularly insulated gate transistors fabricated of silicon carbide semiconductor material.

A common semiconductor device is known generally as an insulated gate field-effect transistor (IGFET), and a more particular example is a metal-oxide-semiconductor field-effect transistor (MOSFET). A MOSFET advantageously has a high gate impedance, and such devices are used in a wide variety of applications, ranging from both digital and analog integrated circuits in which a multiplicity of individual MOSFETs are formed on a single semiconductor "chip" and comprising a useful device such as an amplifier, to large power semiconductor devices comprising a single transistor per device.

In a typical MOSFET transistor structure, a gate electrode comprises a metal layer formed over a relatively thin layer of gate oxide, which serves as an electrical insulator between the gate electrode and the rest of the device. A well-known disadvantage of this device structure is that, in view of the high gate impedance, casually generated electrostatic charges can easily produce voltages higher than that which the insulating gate oxide can withstand, resulting in rupture of the gate oxide and consequent destruction of the device.

Such device destruction is primarily of concern during device handling, transport, or the like, prior to being installed within an actual circuit. For this reason, appropriate handling precautions are routinely employed, such as grounding of persons and equipment that are likely to contact MOSFET semiconductor devices during handling, and use of conductive packaging which tends to provide shunt current paths between the various terminals of a semiconductor device package. In most cases, once a device is installed within a circuit, other circuit elements serve to minimize the opportunity for destructive static charge buildup.

Gate protection is conventionally provided within MOSFET semiconductor device structures, particularly in silicon semiconductor devices, by including integral protection devices, such as avalanche (Zener) diodes which are reverse biased during normal circuit operation, and yet conduct when excessive voltage is applied so as to prevent damage to the gate oxide layer.

Other semiconductor device materials, however, are not amenable to conventional techniques for providing gate oxide protection structures, such as, for example, amplifiers and other integrated circuits which employ silicon carbide (SIC) semiconductor material. Advantageously, SiC is a crystalline substance that can withstand very high temperatures. Semiconductor devices manufactured on SiC substrates can withstand temperatures in excess of 200° C. Thus, SiC based semiconductors are desirable for applications that require exposure to high temperatures, such as gas turbine control circuits. SiC, however, presents a number of fabrication difficulties, some of which are addressed in Krishnamurthy et al. U.S. patent application Ser. No. 08/201,494, filed Feb. 24, 1994, entitled "Silicon Carbide Integrated Circuits", assigned to the instant assignee and now U.S. Pat. No. 5,385,855. Another fabrication difficulty, which particularly relates to gate protection, is that it is difficult to form Zener diodes in SiC that are effective for gate protection. While it is possible to fabricate a zener diode in a SiC semiconductor device, the Zener breakdown voltage is typically so high (for example 500 volts or more) that insulated gate protection is ineffective. Thus, the gate oxide or other gate insulation breaks down before the Zener avalanche voltage is reached.

SUMMARY OF THE INVENTION

Accordingly, an object of the invention is to provide alternative structures for protecting gate insulation in an insulated gate transistor, particularly in a transistor employing silicon carbide as the semiconductor material.

Briefly, in accordance with the invention, a depletion mode field-effect protection transistor has a pair of transistor main terminals which are electrically connected, respectively, to the insulated gate terminal and a main terminal, such as the source terminal, of a primary insulated gate field-effect transistor to be protected. Since a depletion mode field-effect transistor is normally conducting when no gate voltage is applied, this arrangement effectively provides a shunt current path from the gate to the source of the primary transistor being protected. In other words, the protection transistor provides a low impedance discharge path for electrostatic charges when the protection transistor is not biased out of conduction.

For normal operation of the circuit of which the primary insulated gate field-effect transistor comprises a part, there is provision for biasing the protection transistor out of conduction by applying a suitable voltage to its gate terminal. One technique is simply to provide an external device terminal which, when in circuit with power applied, is suitably biased.

In another arrangement, requiring no additional external device terminals, a biasing resistor is provided in series between one of the primary transistor main terminals, such as the source terminal, and a corresponding device main terminal. The protection transistor gate terminal is then electrically connected to the device main terminal such that a voltage is developed across the biasing resistor for biasing the protection transistor out of conduction when circuit operating voltage is applied to the device main terminals. Current in the biasing resistor is sufficient to develop a voltage drop for biasing the protection transistor out of conduction.

BRIEF DESCRIPTION OF THE DRAWINGS

While the novel features of the invention are set forth with particularity in the appended claims, the invention, both as to organization and content, will be better understood and appreciated from the following detailed description taken in conjunction with the drawings, in which:

DETAILED DESCRIPTION

Figure 1:
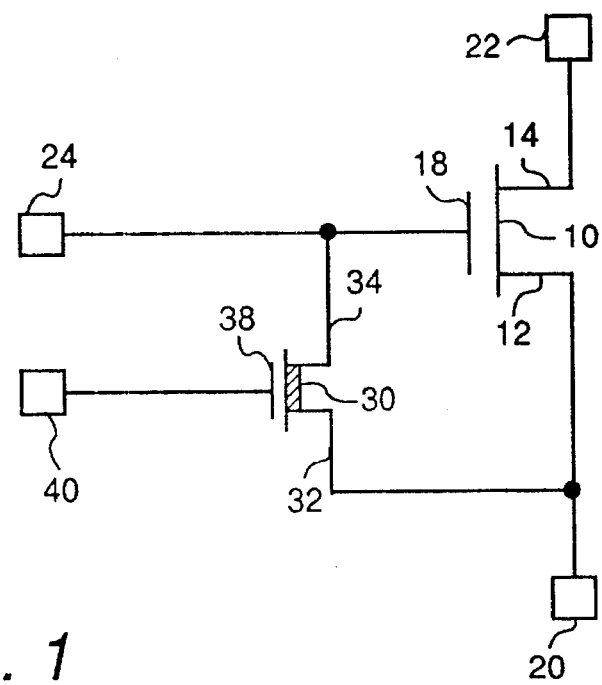
FIG. 1 is an electrical schematic diagram of one embodiment of the invention.

FIG. 1 depicts the invention in generalized form. A primary insulated gate field-effect transistor 10, also herein termed the protected transistor, has a pair of primary main terminals, such as source 12 and drain 14 terminals, and an insulated gate electrode 18. Typically, transistor 10 is included as one transistor of the multiplicity of transistors in an integrated circuit, such as an amplifier or other integrated circuit device. Representative circuit nodes 20 and 22 are accordingly shown coupled to the device main terminals 12 and 14. Another circuit node 24 is coupled to gate electrode 18.

As described hereinabove, gate electrode 18 is insulated from the rest of device 10 by a suitable insulating layer (not shown), such as an oxide, which is susceptible to destruction as a result of electrostatic charge buildup, particularly during handling of device 10.

Typically, primary transistor 10 needing protection comprises the input stage of an operational amplifier, and circuit node 24 accordingly comprises an external device terminal available to be contacted during device handling.

A protection transistor 30 is provided, comprising a depletion mode field-effect transistor 30. Transistor 30 includes a pair of protection transistor main terminals 32 and 34, such as source terminal 32 and drain terminal 34, and a gate electrode 38. Although protection transistor 30 is shown as also having an insulated gate structure, the protection transistor may alternatively comprise another form of semiconductor device, such as a junction field-effect transistor (JFET).

As is well known, a depletion mode field-effect transistor is normally conductive through an internal channel between its source 32 and drain 34 terminals A depletion mode field-effect transistor becomes non-conducting only when a suitable bias voltage is applied to its gate electrode 38, typically with reference to source terminal 32, to internally form a depletion region within the conductive channel which blocks or pinches off the conductive channel when sufficient voltage is applied. The device is thus biased out of conduction. With no gate voltage applied to protection transistor 30, primary transistor gate electrode 18 is effectively shunted to primary transistor 10 source terminal 12, preventing destructive buildup of static charges.

For normal in-circuit operation of protected transistor 10, an appropriate biasing voltage source is applied to circuit node 40 for biasing protection transistor 30 out of conduction.

Figure 2:
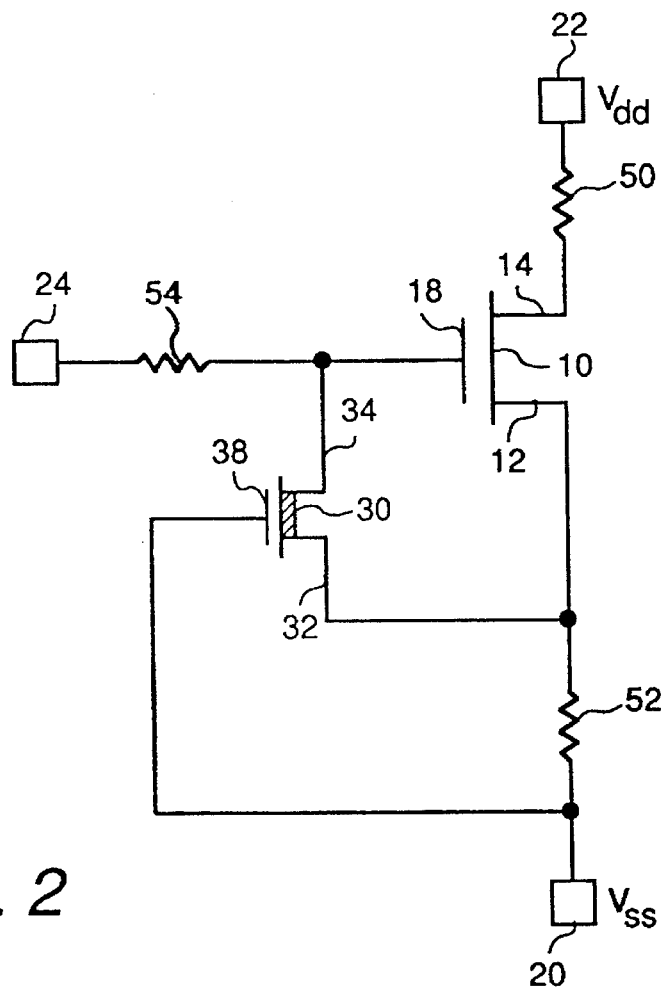
FIG. 2 is an electrical schematic diagram of an alternative embodiment of the invention.

FIG. 2 schematically illustrates the protected transistor of FIG. 1 in an integrated circuit application. Thus, a resistance in series between circuit node 22 and drain terminal 14 may comprise a load resistor 50, and another resistance, such as a load resistor 52, is in series between circuit node 20 and device 10 source terminal 12. In accordance with the invention, load resistor 52 also serves as a biasing resistance.

Circuit nodes 20 and 22 may be viewed as merged with device 10 main terminals and, in this regard, may either be internal to a larger integrated circuit device, and hence not directly accessible, or they may be accessible terminals of an integrated circuit package.

Circuit node 24 comprises a device input and, typically, is accessible to an external device package terminal (not shown), thus leading to the need for gate protection.

The circuit of FIG. 2 differs from that of FIG. 1 primarily in that protection transistor 30 gate electrode 38 is connected to device terminal 20 such that, when operating voltage is applied between device main terminals 20 and 22, current in biasing resistor 52 produces a voltage drop thereacross of sufficient amplitude to bias protection transistor 30 out of conduction, thereby enabling normal operation of device 10.

For additional protection, a series gate protection resistor 54 may be provided in series between the external device gate terminal 24 and device 10 gate electrode 18.

By way of example and not of limitation, typical operating conditions in the circuit of FIG. 2 may include a Vss voltage of −5 volts applied to terminal 20, a Vdd voltage of +10 volts applied to terminal 22, and a zero volt bias applied to input terminal 24. In this example, primary or protected transistor 10 is an N-channel depletion mode MOSFET.

Advantageously, the circuits of FIGS. 1 and 2 may readily be implemented in a device structure without requiring any additional processing steps. Suitable fabrication techniques are disclosed in the above-referenced application Ser. No. 08/201,494.

The present invention provides an effective technique for protecting MOSFETs from high voltage electrostatic discharge damage to gate oxide, and is particularly useful in devices such as silicon carbide amplifiers and integrated circuits, where conventional gate protection structures cannot readily be employed.

While only certain preferred features of the invention have been illustrated and described herein, many other modifications and changes will occur to those skilled in the art. It is, therefore, to be understood that the appended claims are intended to cover all such modifications and changes as fall within the true spirit and scope of the invention.

What is claimed is:

1. An electrostatic-discharge-protected insulated gate transistor device comprising:

a primary insulated gate field-effect transistor having a pair of main terminals and an insulated gate electrode;

a depletion mode field-effect protection transistor having a pair of main terminals and a gate electrode;

said protection transistor main terminals being electrically coupled, respectively, to said primary transistor insulated gate electrode and one of said primary transistor main terminals, respectively, so as to provide a low impedance discharge path for electrostatic charges when said protection transistor is not biased out of conduction;

a pair of device main terminals electrically coupled, respectively, to said primary transistor main terminals respectively;

a device gate terminal;

circuit means coupling said primary transistor insulated gate electrode to said device gate terminal; and a biasing resistance coupled in series with said one of said primary transistor main terminals and a corresponding one of said device main terminals;

said protection transistor gate electrode being electrically coupled to said corresponding one of said device main terminals such that a voltage is across said biasing resistance for biasing said protection transistor out of conduction when circuit operating voltage is applied to said device main terminals.

2. The device of claim 1 wherein said circuit means comprises a resistance.

3. The device of claim 1 wherein said primary transistor and said protection transistor are each comprised of silicon carbide.

4. The device of claim 2 wherein said primary transistor and said protection transistor are each comprised of silicon carbide.

5. In an insulated gate silicon carbide field-effect transistor including a gate insulating layer therein, a method of protecting the gate insulating layer from electrostatic charges, said insulated gate field-effect transistor including a gate electrode and a pair of main terminals, said method comprising the steps of providing a normally conductive path between said gate electrode and one of said main terminals, and biasing said normally conductive path out of conduction when said insulated gate field-effect transistor is conducting.

6. The method of claim 5, further comprising the step of retaining said normally conductive path in its conductive state whenever said insulated gate field-effect transistor is out of conduction.

* * * * *